United States Patent
Rothberg

(10) Patent No.: US 7,562,282 B1
(45) Date of Patent: Jul. 14, 2009

(54) DISK DRIVE EMPLOYING ERROR THRESHOLD COUNTERS TO GENERATE AN ECC ERROR DISTRIBUTION

(75) Inventor: Michael S. Rothberg, Foothill Ranch, CA (US)

(73) Assignee: Western Digital Technologies, Inc., Lake Forest, CA (US)

( * ) Notice: Subject to any disclaimer, the term of this patent is extended or adjusted under 35 U.S.C. 154(b) by 647 days.

(21) Appl. No.: 11/134,915

(22) Filed: May 23, 2005

(51) Int. Cl.
*H03M 13/00* (2006.01)

(52) U.S. Cl. .................. 714/785; 714/54; 714/758; 714/784; 714/799

(58) Field of Classification Search ................ 714/758, 714/781, 799, 52, 54, 784, 785
See application file for complete search history.

(56) References Cited

U.S. PATENT DOCUMENTS

| | | | |
|---|---|---|---|
| 5,121,263 A | | 6/1992 | Kerwin et al. |
| 5,384,786 A | * | 1/1995 | Dudley et al. ............... 714/784 |
| 5,422,890 A | | 6/1995 | Klingsporn et al. |
| 5,490,091 A | | 2/1996 | Kogan et al. |
| 5,537,421 A | * | 7/1996 | Dujari et al. ................ 714/785 |
| 5,844,920 A | * | 12/1998 | Zook et al. ................... 714/769 |
| 5,926,490 A | * | 7/1999 | Reed et al. ................... 714/787 |
| 6,044,483 A | * | 3/2000 | Chen et al. ................... 714/762 |
| 6,092,231 A | * | 7/2000 | Sze ............................. 714/758 |
| 6,125,469 A | * | 9/2000 | Zook et al. ................... 714/769 |
| 6,606,211 B1 | | 8/2003 | Lim et al. |
| 6,785,077 B2 | | 8/2004 | Lim et al. |
| 6,842,872 B2 | | 1/2005 | Yedida et al. |
| 7,171,594 B2 | * | 1/2007 | Wyatt et al. ................. 714/704 |
| 2003/0007269 A1 | | 1/2003 | Alex |

* cited by examiner

*Primary Examiner*—Esaw T Abraham
(74) *Attorney, Agent, or Firm*—Howard H. Sheerin, Esq.

(57) ABSTRACT

A disk drive is disclosed comprising a head actuated over a disk. A redundancy generator generates a plurality of redundancy symbols appended to user data to form a codeword C(x) written to a selected data sector on the disk. During a read operation, a syndrome generator generates a plurality of error syndromes in response to a received codeword C'(x) generated by reading the selected data sector. An error detector, responsive to the error syndromes, detects a number of errors in the received codeword C'(x), and a plurality of counters count a number of times the number of errors falls within a predetermined plurality of ranges to thereby provide a distribution of the errors. The error distribution is used, for example, for selecting a track density or ECC depth, or for failure prediction or defect mapping.

22 Claims, 5 Drawing Sheets

DISK DRIVE EMPLOYING ERROR THRESHOLD COUNTERS TO GENERATE AN ECC ERROR DISTRIBUTION

BACKGROUND OF THE INVENTION

1. Field of the Invention

The present invention relates to disk drives for computer systems. More particularly, the present invention relates to a disk drive employing error threshold counters to generate an error correction code (ECC) error distribution.

2. Description of the Prior Art

Disk drives comprise one or more disks having a plurality of tracks which are partitioned into a number of data sectors. A head coupled to a distal end of an actuator arm is actuated over the disk to access a target data sector by rotating the actuator arm about a pivot. The user data stored in the data sectors is typically encoded using an error correction code (ECC), such as a Reed-Solomon code, to account for imperfections in the recording/reproduction process. The number of errors that can be corrected using ECC depends on the number of redundancy symbols appended to each data sector. A Reed-Solomon code, for example, can correct up to t erroneous data symbols for every 2t redundancy symbols appended to the data sector.

During the decoding process, the ECC decoder generates 2t error syndromes for use in detecting the location and magnitude of the erroneous symbols in a data sector. If the number of erroneous symbols exceeds the error correction capability of the ECC, the ECC decoder flags the data sector as uncorrectable, and the disk drive performs a retry read of the data sector. Accordingly, prior art ECC decoders only provide an indication as to whether the number of erroneous symbols exceeds the error correction capability of the code. This limited information provides little insight into the actual integrity of the disk drive. That is, knowing only whether a data sector is recoverable using ECC provides no insight into the actual number of data symbols and/or bits in error, which may be useful for various aspects of manufacturing and operation, such as binning disk drives during manufacturing based on quality, selecting a target density per disk (e.g., track density or ECC depth), and in-the-field failure prediction and/or data protection (defect mapping).

SUMMARY OF THE INVENTION

The present invention may be regarded as a disk drive comprising a disk having a plurality of data tracks, wherein each data track comprises a plurality of data sectors. A head is actuated over the disk, and control circuitry receives user data from a host. A redundancy generator generates a plurality of redundancy symbols appended to the user data to form a codeword C(x) written to a selected one of the data sectors. A syndrome generator generates a plurality of error syndromes in response to a received codeword C'(x) generated by reading the selected data sector. An error detector, responsive to the error syndromes, detects a number of errors in the received codeword C'(x), and a plurality of counters count a number of times the number of detected errors falls within a plurality of predetermined ranges to thereby generate a distribution of detected errors.

In one embodiment, the number of detected errors in the received codeword C'(x) is the number of erroneous symbols in the received codeword C'(x). In another embodiment, the number of detected errors in the received codeword C'(x) is the number of bit errors in the received codeword C'(x).

In yet another embodiment, the redundancy symbols and error syndromes are generated using a Reed-Solomon error correction code.

In still another embodiment, a track density for the disk drive is selected in response to the counters.

In another embodiment, the number of redundancy symbols is selected in response to the counters, and in another embodiment, a number of bits in each redundancy symbol is selected in response to the counters.

In yet another embodiment, the disk drive generates a failure prediction indicator in response to the counters.

In another embodiment, the disk drive adjusts a threshold for detecting and relocating marginal data sectors in response to the counters.

The present invention may also be regarded as an integrated circuit for use in a disk drive, the disk drive comprising a head actuated over a disk, wherein the disk having a plurality of data tracks each comprising a plurality of data sectors. The integrated circuit comprises control circuitry for receiving user data from a host, and a redundancy generator for generating a plurality of redundancy symbols appended to the user data to form a codeword C(x) written to a selected one of the data sectors. A syndrome generator generates a plurality of error syndromes in response to a received codeword C'(x) generated by reading the selected data sector. An error detector, responsive to the error syndromes, detects a number of errors in the received codeword C'(x), and a plurality of counters each count a number of times the number of detected errors falls within a predetermined range to thereby generate a distribution of the detected errors.

The present invention may also be regarded as a method of operating a disk drive, the disk drive comprising a head actuated over a disk, wherein the disk having a plurality of data tracks each comprising a plurality of data sectors. User data is received from a host, and a plurality of redundancy symbols are appended to the user data to form a codeword C(x) written to a selected one of the data sectors. A plurality of error syndromes are generated in response to a received codeword C'(x) generated by reading the selected data sector. A number of errors are detected in the received codeword C'(x) in response to the error syndromes, and a number of times the number of detected errors falls within a plurality of predetermined ranges are counted to generate a distribution of the detected errors.

DESCRIPTION OF THE PREFERRED EMBODIMENTS

Figure 1:
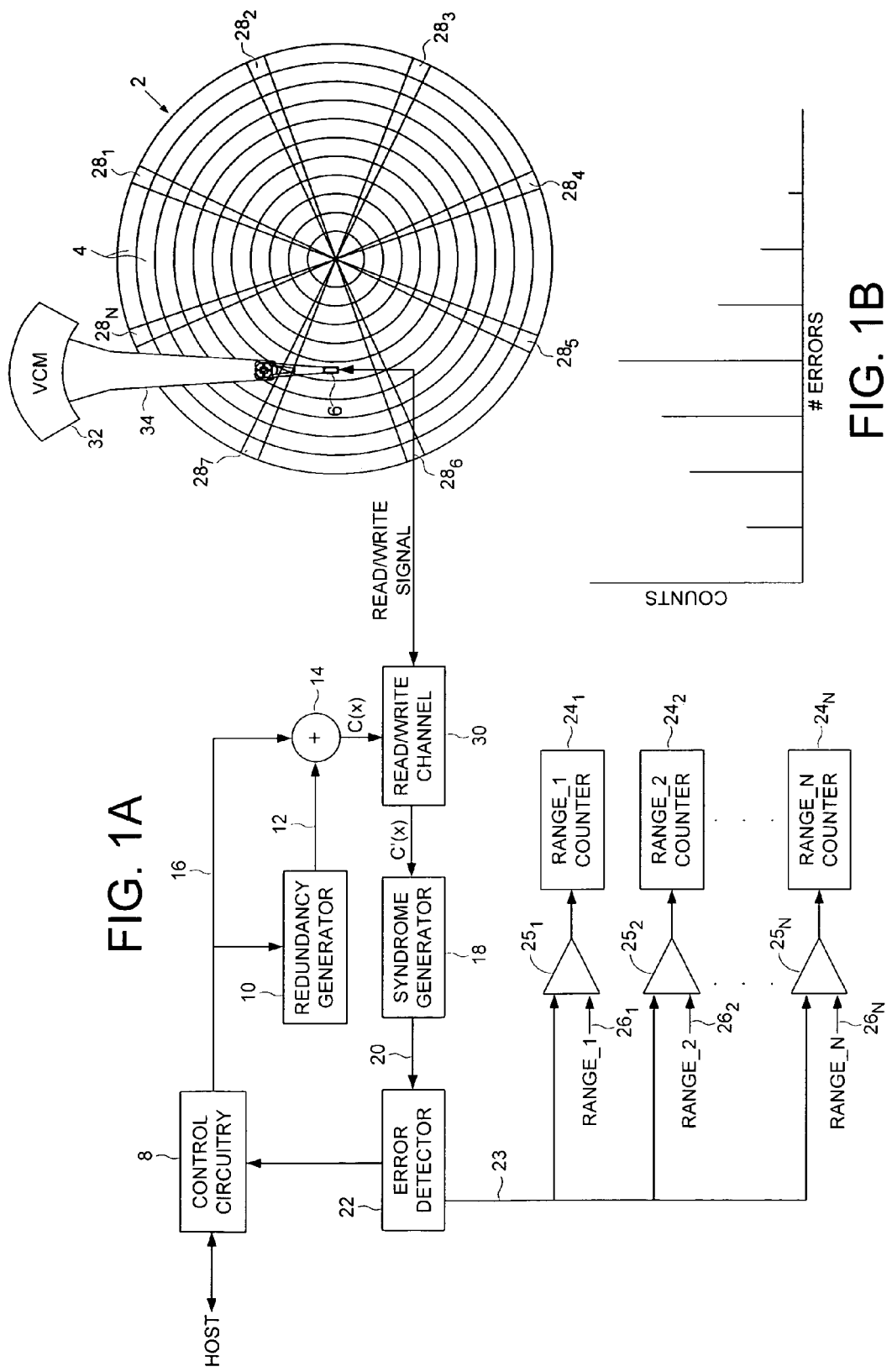
FIG. 1A shows a disk drive according to an embodiment of the present invention comprising a syndrome generator for generating a number of error syndromes used to detect a number of errors in a data sector, and a plurality of counters for counting a number of times the number of detected errors falls within a predetermined range to thereby generate a distribution of the detected errors.
FIG. 1B shows an example distribution of detected errors for a plurality of data sectors.

FIG. 1A shows a disk drive according to an embodiment of the present invention comprising a disk 2 having a plurality of data tracks 4, wherein each data track 4 comprises a plurality of data sectors. A head 6 is actuated over the disk 2, and control circuitry 8 receives user data from a host. A redundancy generator 10 generates a plurality of redundancy symbols 12 appended 14 to the user data 16 to form a codeword C(x) written to a selected one of the data sectors. A syndrome generator 18 generates a plurality of error syndromes 20 in response to a received codeword C(x) generated by reading the selected data sector. An error detector 22, responsive to the error syndromes 20, detects a number of errors 23 in the received codeword C'(x), and a plurality of counters $24_1$-$24_N$ count a number of times the number of detected errors 23 falls within a plurality of predetermined ranges $26_1$-$26_N$ to thereby generate a distribution of detected errors (an example shown in FIG. 1B).

In the embodiment of FIG. 1A, a number of comparators $25_1$-$25_N$ compare the number of detected errors 23 to the plurality of ranges $26_1$-$26_N$. The output of a particular comparator $25_i$ is activated if the number of detected errors 23 falls within the corresponding range $26_i$, wherein the output of the comparator $25_i$ increments the corresponding counter $24_i$.

Also in the embodiment of FIG. 1A, the disk 2 comprises a plurality of embedded servo sectors $28_1$-$28_N$ each comprising coarse positioning information (track address) for seeking the head 6 to a target track, and a plurality of servo bursts that provide fine positioning information for maintaining the head 6 along the centerline of the target track during read/write operations. A read/write channel 30 writes the codeword C(x) to a target data sector by modulating a current in the head 6 in order to write a corresponding number of magnetic transitions on the disk 2. During a read operation, the head 6 detects the magnetic transitions to generate a read signal that is demodulated by the read/write channel 30 into an estimated data sequence representing the received codeword C(x). The read/write channel 30 also demodulates the embedded servo sectors $28_1$-$28_N$ to detect the radial location of the head 6, and a position error signal (PES) is generated as the difference between the detected location of the head 6 and a target location (centerline of the target track). The control circuitry 8 processes the PES to generate a control signal applied to a voice coil motor (VCM) 32 which rotates an actuator arm 34 about a pivot in order to actuate the head 6 radially over the disk 2.

FIG. 1B shows an example distribution of detected errors in response to reading a plurality of data sectors from the disk 2. The x-axis represents the plurality of counters $24_1$-$24_N$ (and corresponding error ranges), and the y-axis represents the value of each counter, that is, the number of times the number of detected errors fell within the corresponding range. Any suitable resolution may be selected for the plurality of ranges, that is, the resolution may be selected so that each range corresponds to an incremental change in the number of detected errors, wherein the increment may be one or more. In addition, each detected error may correspond to any portion of the received codeword C'(x), such as a symbol of the received codeword C'(x) or a single bit.

Any suitable error correction code (ECC) may be employed in the embodiments of the present invention to detect errors in the received codeword C'(x). In one embodiment, the redundancy symbols 12 and the error syndromes 20 are generated using a Reed-Solomon error correction code. A Reed-Solomon code is a linear block code which encodes data symbols into a codeword comprising the data symbols and appended redundancy symbols. The codeword symbols are selected from a Galois field $GF(2^m)$. A Reed-Solomon (n,k) code encodes k input symbols into a codeword comprising n symbols, wherein the correction power of the code is n−k=2t where t is the number of symbols per codeword that can be detected and corrected.

Figure 2:
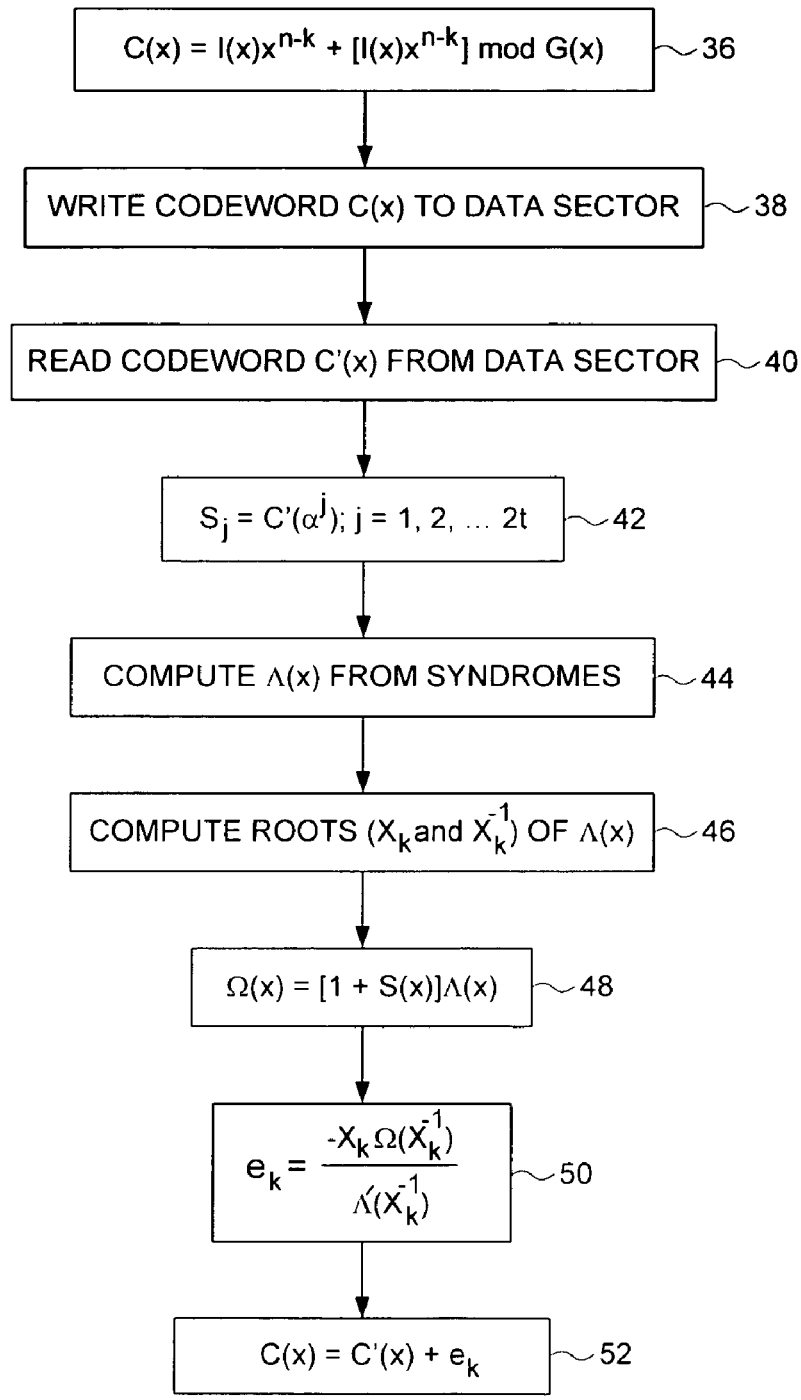
FIG. 2 is a flow diagram illustrating an embodiment of the present invention wherein the redundancy symbols and error syndromes are generated using a Reed-Solomon error correction code (ECC).

FIG. 2 is a flow diagram illustrating the general procedure for encoding and decoding codewords (data sectors) using a Reed-Solomon code. At step 36 user data represented as an input polynomial I(x) is encoded into a codeword polynomial C(x) by appending redundancy symbols computed by dividing the input polynomial I(x) (multiplied by $x^{n-k}$) by a suitable generator polynomial G(x). The coefficients of the codeword polynomial C(x) represent the encoded data written to a selected one of the data sectors at step 38. At step 40 the selected data sector is read to generate a received codeword C'(x) having coefficients of which represent the detected codeword symbols. The received codeword C'(x) comprises one or more errors which are detected by generating error syndromes $S_j$. Each error syndrome $S_j$ is generated at step 42 by evaluating the received codeword polynomial C'(x) at the roots $\alpha^j$ of the generator polynomial G(x). At step 44 an error locator polynomial Λ(x) is generated from the error syndromes $S_j$ using, for example, the Berlekamp-Massey algorithm. At step 46 the roots of the error locator polynomial Λ(x) are computed to find the error locations ($X_k$ and $X_k^{-1}$). At step 48 an error magnitude polynomial Ω(x) is generated in response to the error syndromes $S_j$ and the error locator polynomial Λ(x), and at step 50 the error magnitudes $e_k$ are computed. At step 52 the received codeword C'(x) is corrected using the error magnitudes $e_k$ to generated the corrected codeword C(x) the coefficients of which represent the corrected user data transmitted to the host.

Figure 3A:
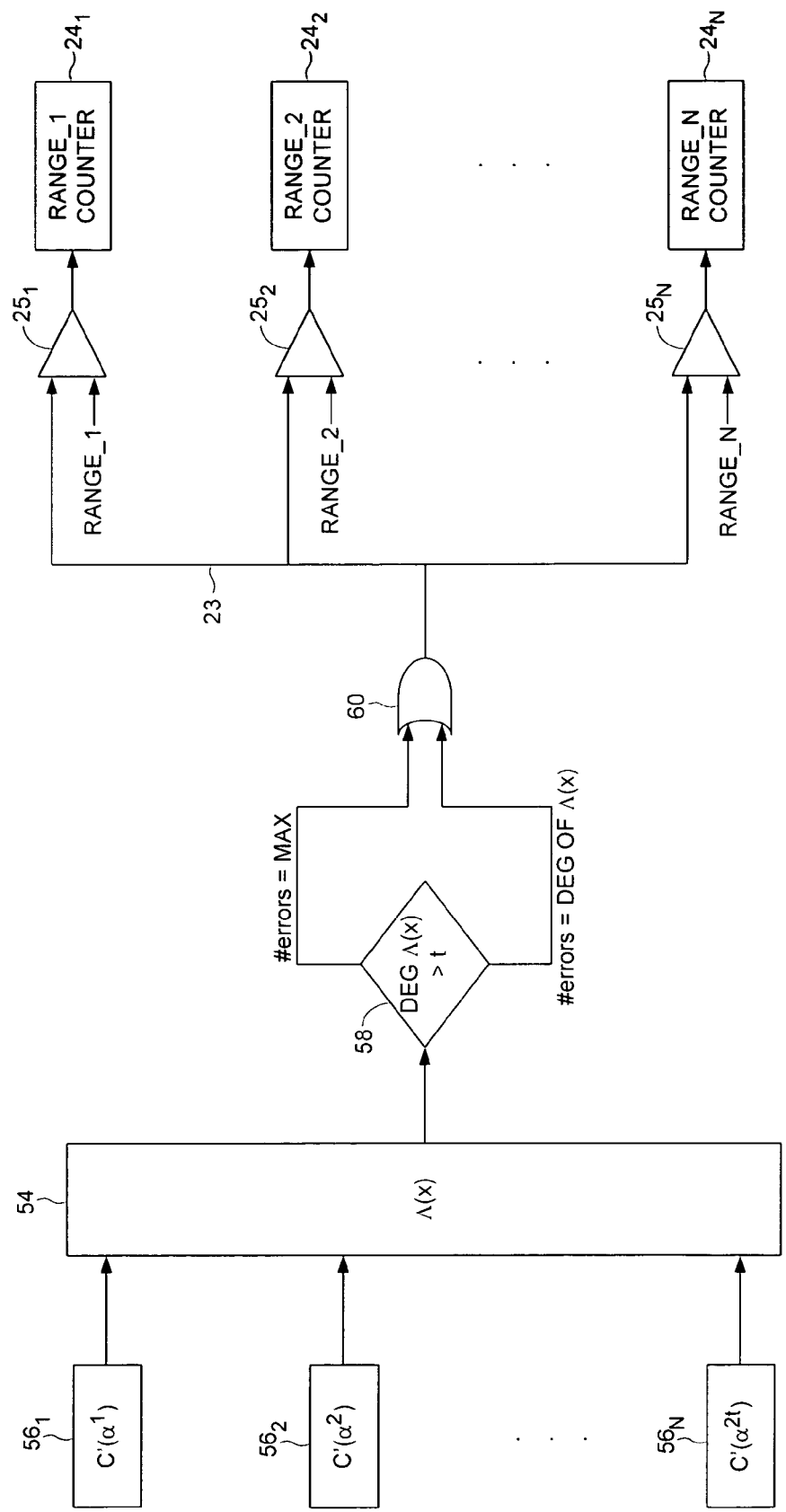
FIG. 3A shows an embodiment of the present invention wherein the number of detected errors equals the number of symbols in error in a data sector which is determined from the degree of the error locator polynomial $\Lambda(x)$.

FIG. 3A shows circuitry according to an embodiment of the present invention for generating a number of detected errors 23 equal to the number of erroneous symbols in the received codeword C'(x). In a Reed-Solomon code, the number of erroneous symbols is determined from the degree of the error locator polynomial Λ(x). Therefore, in the embodiment of FIG. 3A the number of detected errors (number of erroneous symbols) is determined from the error locator polynomial Λ(x) generated 54 in response to the error syndromes $56_0$-$56_N$. At step 58 the degree of the error locator polynomial Λ(x) is compared to the error correction capability t of the Reed-Solomon code. If the degree of the error locator polynomial Λ(x) is greater than t (meaning the codeword is uncorrectable), then the number of errors is set to a predetermined maximum. Otherwise, the number of errors is set to the degree of the error locator polynomial Λ(x). An OR-gate 60 then selects from the non-zero output of step 58 to generate the number of detected errors 23.

Figure 3B:
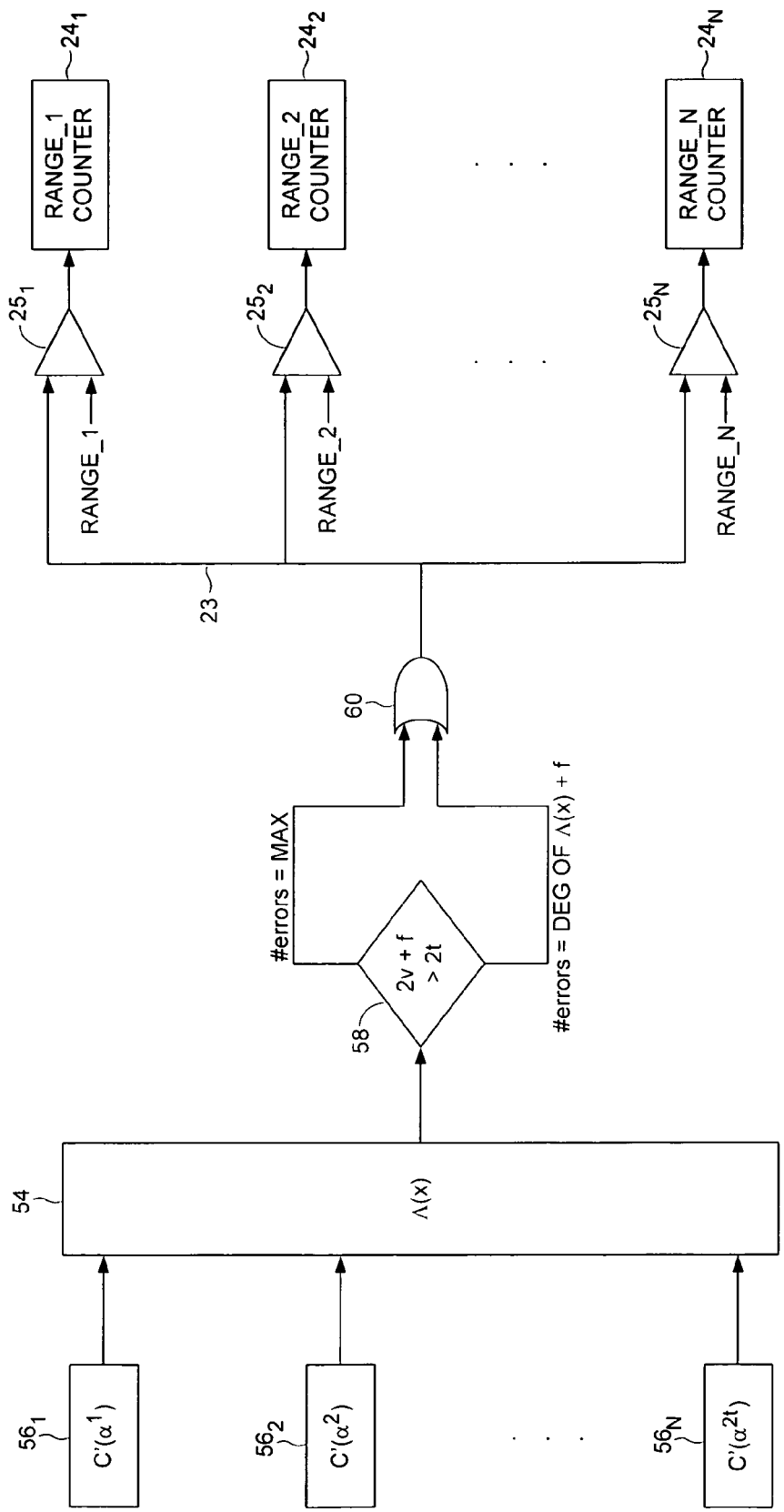
FIG. 3B shows an embodiment of the present invention wherein the disk drive generates erasure pointers identifying known symbols in error which increases the error correction capability of the Reed-Solomon code.

In another embodiment, the disk drive generates a number of erasure pointers which identify symbols of the received codeword polynomial C'(x) that are known to be in error. For example, the disk drive may employ a primary and secondary sync marks in each data sector, wherein the symbols between the sync marks are erased if the primary sync mark is missed. A Reed-Solomon code is able to correct 2v+f (up to 2t)

erroneous symbols in the received codeword C'(x) where v is the number of detected errors and f is the number of erasure pointers. FIG. 3B shows how FIG. 3A is modified to incorporate erasure pointers into finding the number of erroneous symbols in the received codeword C'(x).

In an alternative embodiment, the number of detected errors corresponds to the number of bit errors in the received codeword C'(x). In one embodiment, the number of bit errors is determined by summing the number of "1" bits in the error correction values $e_k$ generated at step 50 of FIG. 2. That is, each "1" bit in the error correction values $e_k$ corresponds to a bit error in the received codeword C'(x). Generating a distribution of bit errors (as opposed to a distribution of symbol errors) further increases the resolution of information used to modify any suitable aspect of the disk drive.

In one embodiment, the distribution of errors is used to select a track density (tracks per inch) for each disk surface in the disk drive. For example, during manufacturing each disk surface may be evaluated at a nominal track density to determine the corresponding error distribution. The actual track density for each disk surface may then be selected by evaluating the error distribution. For example, a lower track density may be selected for a disk surface having an error distribution that indicates a high occurrence of errors exceeding a predetermined threshold, such as the error correction capability of the Reed-Solomon code. Alternatively, each disk surface may be written with a different track density until a target error distribution is achieved.

Figure 4:
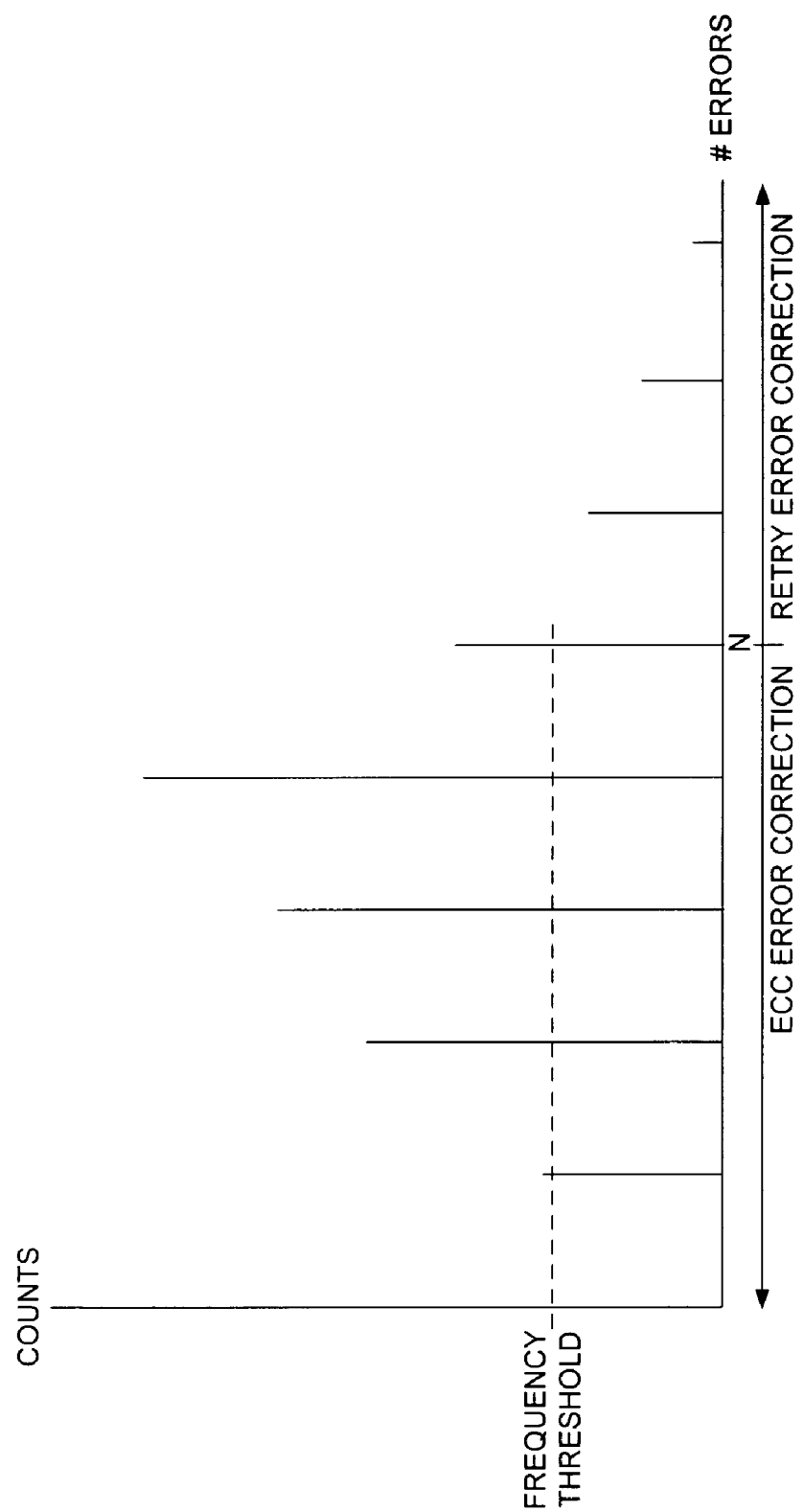
FIG. 4 illustrates an embodiment of the present invention wherein the error correction capability of the code (ECC depth) is selected by comparing the error distribution to a predetermined frequency threshold.

In another embodiment, the correction capability of the ECC (ECC depth) is selected in response to the error distribution. The correction capability of the ECC is increased by increasing the number of bits per redundancy symbol, or by increasing the number of redundancy symbols by increasing the order of the generator polynomial. In one embodiment, the redundancy symbols may be selected such that the error correction capability of the Reed-Solomon code enables a predetermined percentage of successful error correction relative to the error distribution. In an alternative embodiment shown in FIG. 4, the redundancy symbols are selected so that the ECC corrects a number of errors up to a predetermined frequency threshold (frequency of occurrence), and all remaining errors are corrected using retry procedures. That is, the number/length of redundancy symbols is selected to correct up to N errors having a frequency of occurrence in the error distribution that exceeds the frequency threshold, whereas errors exceeding N are corrected using retry procedures. In one embodiment, the threshold in FIG. 4 is selected relative to a specific application (e.g., audio/video, computer data, etc.) to optimize format efficiency, reliability, and access time.

In one embodiment, during manufacturing the correction capability of the code is increased (e.g., maximized) to maximize the error detection capability of the Reed-Solomon code and thereby maximize the range of the error distribution. Once the error distribution is generated, the correction capability of the code is reduced to achieve an acceptable correction capability and format efficiency for each disk surface.

In another embodiment, an error distribution is maintained during normal operation of the disk drive while in the field to facilitate other operations, such as failure prediction or mapping of marginal data sectors to spare sectors. For example, if the error distribution indicates a high occurrence of errors that exceed a predetermined threshold, the disk drive may transmit a failure indicator to the host so that the disk drive can be repaired or replaced to prevent catastrophic data loss. Similarly, if the error distribution indicates that the number of errors for a particular disk surface is progressing toward the high end of the error distribution, the threshold used to identify a marginal data sector for defect mapping may be adjusted to utilize the spare sectors more efficiently.

In yet another embodiment of the present invention, the error distribution may be evaluated to "waterfall" disk drives during manufacturing. For example, if the error distribution indicates a high occurrence of errors exceeding a predetermined threshold, the disk drive may be binned with other drives having a similar error distribution and corresponding reliability. The less reliable disk drives are then shipped to customers that do not require a high degree of reliability, such as disk drives employed in audio/video applications which can typically tolerate a higher percentage of defective (unrecoverable) data sectors.

I claim:

1. A disk drive comprising:
   (a) a disk comprising a plurality of data tracks, wherein each data track comprises a plurality of data sectors;
   (b) a head actuated over the disk;
   (c) control circuitry for receiving user data from a host;
   (d) a redundancy generator for generating a plurality of redundancy symbols appended to the user data to form a codeword C(x) written to a selected one of the data sectors;
   (e) a syndrome generator for generating a plurality of error syndromes in response to a received codeword C'(x) generated by reading the selected data sector;
   (f) an error detector, responsive to the error syndromes, for detecting a number of errors in the received codeword C'(x); and
   (g) a plurality of counters, wherein each counter for counting a number of times the number of detected errors falls within a predetermined range to thereby generate a distribution of the detected errors.

2. The disk drive as recited in claim 1, wherein the number of detected errors in the received codeword C'(x) is the number of erroneous symbols in the received codeword C'(x).

3. The disk drive as recited in claim 1, wherein the number of detected errors in the received codeword C'(x) is the number of bit errors in the received codeword C'(x).

4. The disk drive as recited in claim 1, wherein the redundancy symbols and error syndromes are generated using a Reed-Solomon error correction code.

5. The disk drive as recited in claim 1, wherein a track density for the disk drive is selected in response to the counters.

6. The disk drive as recited in claim 1, wherein the number of redundancy symbols is selected in response to the counters.

7. The disk drive as recited in claim 1, wherein a number of bits in each redundancy symbol is selected in response to the counters.

8. The disk drive as recited in claim 1, wherein the disk drive generates a failure prediction indicator in response to the counters.

9. The disk drive as recited in claim 1, wherein the disk drive adjusts a threshold for detecting and relocating marginal data sectors in response to the counters.

10. An integrated circuit for use in a disk drive, the disk drive comprising a head actuated over a disk, wherein the disk comprising a plurality of data tracks each comprising a plurality of data sectors, the integrated circuit comprising:
    (a) control circuitry for receiving user data from a host;
    (b) a redundancy generator for generating a plurality of redundancy symbols appended to the user data to form a codeword C(x) written to a selected one of the data sectors;

(c) a syndrome generator for generating a plurality of error syndromes in response to a received codeword C'(x) generated by reading the selected data sector;

(d) an error detector, responsive to the error syndromes, for detecting a number of errors in the received codeword C'(x); and (e) a plurality of counters, wherein each counter for counting a number of times the number of detected errors falls within a predetermined range to thereby generate a distribution of the detected errors.

11. The integrated circuit as recited in claim 10, wherein the number of detected errors in the received codeword C'(x) is the number of erroneous symbols in the received codeword C'(x).

12. The integrated circuit as recited in claim 10, wherein the number of detected errors in the received codeword C'(x) is the number of bit errors in the received codeword C'(x).

13. The integrated circuit as recited in claim 10, wherein the redundancy symbols and error syndromes are generated using a Reed-Solomon error correction code.

14. A method of operating a disk drive, the disk drive comprising head actuated over a disk, wherein the disk comprising a plurality of data tracks each comprising a plurality of data sectors, the method comprising the steps of:

(a) receiving user data from a host;

(b) generating a plurality of redundancy symbols appended to the user data to form a codeword C(x) written to a selected one of the data sectors;

(c) generating a plurality of error syndromes in response to a received codeword C'(x) generated by reading the selected data sector;

(d) detecting a number of errors in the received codeword C'(x) in response to the error syndromes; and (e) counting a number of times the number of detected errors falls within a plurality of predetermined ranges to thereby generate a distribution of the detected errors.

15. The method as recited in claim 14, wherein the number of detected errors in the received codeword C'(x) is the number of erroneous symbols in the received codeword C'(x).

16. The method as recited in claim 14, wherein the number of detected errors in the received codeword C'(x) is the number of bit errors in the received codeword C'(x).

17. The method as recited in claim 14, wherein the redundancy symbols and error syndromes are generated using a Reed-Solomon error correction code.

18. The method as recited in claim 14, wherein a track density for the disk drive is selected in response to the distribution of detected errors.

19. The method as recited in claim 14, wherein the number of redundancy symbols is selected in response to the distribution of detected errors.

20. The method as recited in claim 14, wherein a number of bits in each redundancy symbol is selected in response to the distribution of detected errors.

21. The method as recited in claim 14, further comprising the step of generating a failure prediction indicator in response to the distribution of detected errors.

22. The method as recited in claim 14, further comprising the step of adjusting a threshold for detecting and relocating marginal data sectors in response to the distribution of detected errors.

* * * * *